United States Patent
Oh et al.

(10) Patent No.: US 8,618,656 B2
(45) Date of Patent: Dec. 31, 2013

(54) FLEXIBLE SEMICONDUCTOR PACKAGE APPARATUS HAVING A RESPONSIVE BENDABLE CONDUCTIVE WIRE MEMBER AND A MANUFACTURING THE SAME

(75) Inventors: Tac Keun Oh, Gyeonggi-do (KR); Sung Min Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 237 days.

(21) Appl. No.: 13/241,455

(22) Filed: Sep. 23, 2011

(65) Prior Publication Data

US 2012/0013016 A1      Jan. 19, 2012

Related U.S. Application Data

(62) Division of application No. 12/347,089, filed on Dec. 31, 2008, now Pat. No. 8,049,332.

(30) Foreign Application Priority Data

Nov. 6, 2008   (KR) .................. 10-2008-0110121

(51) Int. Cl.
*H01L 23/34*  (2006.01)
(52) U.S. Cl.
USPC ............. 257/728; 257/784; 257/E23.025
(58) Field of Classification Search
USPC ............................. 257/728, 784, E23.025
See application file for complete search history.

(56) References Cited

U.S. PATENT DOCUMENTS

| | | | |
|---|---|---|---|
| 7,009,308 B1 | 3/2006 | Jin et al. | |
| 7,227,240 B2 | 6/2007 | Knapp et al. | |
| 7,777,352 B2 | 8/2010 | Mahler et al. | |
| 2005/0199999 A1 | 9/2005 | Shirasawa et al. | |
| 2009/0072416 A1* | 3/2009 | Sano | 257/784 |
| 2009/0102067 A1* | 4/2009 | Wyland | 257/784 |

FOREIGN PATENT DOCUMENTS

| | | |
|---|---|---|
| JP | 2004-140195 A | 5/2004 |
| JP | 2008-107183 A | 5/2008 |
| KR | 1020000029283 A | 5/2000 |
| KR | 1020080067518 A | 7/2008 |

OTHER PUBLICATIONS

USPTO OA mailed Jul. 8, 2010 in connection with U.S. Appl. No. 12/347,089.
USPTO OA mailed Nov. 1, 2010 in connection with U.S. Appl. No. 12/347,089.
USPTO OA mailed Apr. 6, 2011 in connection with U.S. Appl. No. 12/347,089.
USPTO NOA mailed Aug. 4, 2011 in connection with U.S. Appl. No. 12/347,089.

* cited by examiner

Primary Examiner — Phat X Cao
(74) Attorney, Agent, or Firm — Ladas & Parry LLP

(57) ABSTRACT

A flexible semiconductor package apparatus having a responsive bendable conductive wire member is presented. The apparatus includes a flexible substrate, semiconductor chips, and conductive wires. The semiconductor chips are disposed on the flexible substrate and spaced apart from each other on the flexible substrate. Each semiconductor chip has bonding pads. The conductive wires are electrically connected to the bonding pads of the semiconductor chip. Each conductive wire has at least one elastic portion. One preferred configuration is that part of the conductive wire is wound to form a coil spring shape so that the coil spring shape of the conductive wire aid in preventing the conductive wire from being separated from the corresponding bonding pad of the semiconductor chip when the flexible substrate on which the semiconductor chips are mounted are bent, expanded or twisted.

8 Claims, 5 Drawing Sheets

FLEXIBLE SEMICONDUCTOR PACKAGE APPARATUS HAVING A RESPONSIVE BENDABLE CONDUCTIVE WIRE MEMBER AND A MANUFACTURING THE SAME

CROSS-REFERENCE TO RELATED APPLICATIONS

The present application claims priority to Korean patent application number 10-2008-0110121 filed on Nov. 6, 2008, which is incorporated herein by reference in its entirety.

BACKGROUND OF THE INVENTION

The present invention relates to a flexible semiconductor package, more particularly, to a flexible semiconductor package apparatus having a responsive bendable conductive wire member and a method of manufacturing the same.

Recently, semiconductor chips have been developed to store an enormous amount of data and to process enormous amounts of data in a relatively short time period. Furthermore, many modern day semiconductor packages include these types of semiconductor chips.

Semiconductor packages includes a substrate, a semiconductor chip mounted on the substrate, a connection member for connecting the semiconductor chip and the substrate, and a molding member covering the semiconductor chip to protect the semiconductor chip from an external impact. The molding member covering the semiconductor chip is designed to protect the semiconductor chip from external impacts.

As the application and uses semiconductor packages become more and more diversified, flexible semiconductor packages, i.e., those that may be bent without damaging their functionality, are likely to become more desirable and thus needed.

In the flexible semiconductor package, semiconductor chips will still having bonding pads which will have to be mounted on a flexible substrate. The bonding pads of each semiconductor chip will also have to be connected to other bonding pads of other semiconductor chip through conductive wires.

However, a problem may arise when the flexible semiconductor chip is bent or twisted. In particularly, tensile stresses arise when the conductive wire is bent which ends up compromising the integrity of either the conductive wire itself or the electrical connection between it and its corresponding bonding pad.

SUMMARY OF THE INVENTION

Embodiments of the present invention are directed to a flexible semiconductor package that can aid in minimizing the separation problem of the conductive wire away from the bonding pads of the semiconductor chips, when the corresponding flexible semiconductor chip is bent or twisted.

Also, embodiments of the present invention are directed to a wire bonding apparatus for bonding the conductive wire for use in manufacturing the flexible semiconductor package.

In one embodiment, a flexible semiconductor package comprises a flexible substrate; a plurality of semiconductor chips which are spaced apart from each other on the flexible substrate, and each semiconductor chip having bonding pads; and a plurality of conductive wires which electrically connect together the semiconductor chips through their respective bonding pads in which each conductive wire has at least one elastic portion.

The conductive wire of the flexible semiconductor package may also comprise at least two elastic portions. The elastic portion of the present invention is understood to be an electrically conductive member geometrically configured to be flexible by being bendable, extendable, and collapsible. Accordingly, examples of elastic portions are a helical coiled conductive spring and a sinusoidal arranged conductive spring.

The elastic portion of the flexible semiconductor package may be wound at least twice.

The conductive wire of the flexible semiconductor package may further comprise an insulation film on the conductive wire.

The flexible semiconductor package further comprises a flexible material that covers the flexible substrate, the semiconductor chips and the conductive wire.

The flexible material may include a gel.

The flexible semiconductor package may further comprise an additional flexible substrate covering the flexible material.

The elastic portion may have any known shape of design that is resilient to bending and flexing. One preferred configuration of the elastic portion is that has a coil spring shape.

In another embodiment, a flexible semiconductor package comprises a first flexible substrate; a second flexible substrate opposed to the first flexible substrate; a first semiconductor chip disposed on an upper surface of the first flexible substrate, and which has a first bonding pad; a second semiconductor chip disposed on a lower surface of the second flexible substrate that substantially faces the upper surface of the first flexible substrate, in which the second semiconductor chip has a second bonding pad; a conductive wire which electrically connects together the first and second bonding pads to each other, and has at least one elastic portion; and a flexible filling member which is interposed between the first and second flexible substrates.

The flexible filling member of the flexible semiconductor package includes a gel.

The conductive wire of the flexible semiconductor package comprises at least two elastic portions.

The conductive wire of the flexible semiconductor package comprises an insulation film covering the conductive wire.

The elastic portion of the flexible semiconductor package has a coil spring shape.

The first bonding pad of the first semiconductor chip and the second bonding pad of the second bonding pad of the flexible semiconductor package are configured to face with each other.

The first semiconductor chip and the second semiconductor chips of the flexible semiconductor package are disposed opposite to each other, and the first and second bonding pads are adjacent to each other.

In yet another embodiment, a wire bonding apparatus comprises a hollow capillary through which a conductive wire passes; a capillary rotating module which comprises a rotational unit having a rotational shaft, a rotational rod coupled to the rotational shaft, and a capillary rotating unit of which one end is hinged to the rotational rod and the other end is coupled to the hollow capillary; and a conveyer unit which comprises an up-down unit moving up/down the capillary rotating module, and a conveyer unit conveying the capillary rotating module.

The rotational unit includes a motor.

The capillary rotating unit of the wire bonding apparatus further comprises a guide member that guides the capillary rotating unit so that the capillary rotating unit is rotated while being substantially maintained in a given direction.

In the present invention, since a part of the conductive wire, which electrically connects the semiconductor chips, is wound in the responsive form such as a coil responsive form, it aids in is preventing the conductive wire from being separated from the semiconductor chips when the flexible substrate on which the semiconductor chips are mounted is bent, expanded or twisted.

DESCRIPTION OF SPECIFIC EMBODIMENTS

Figure 1:
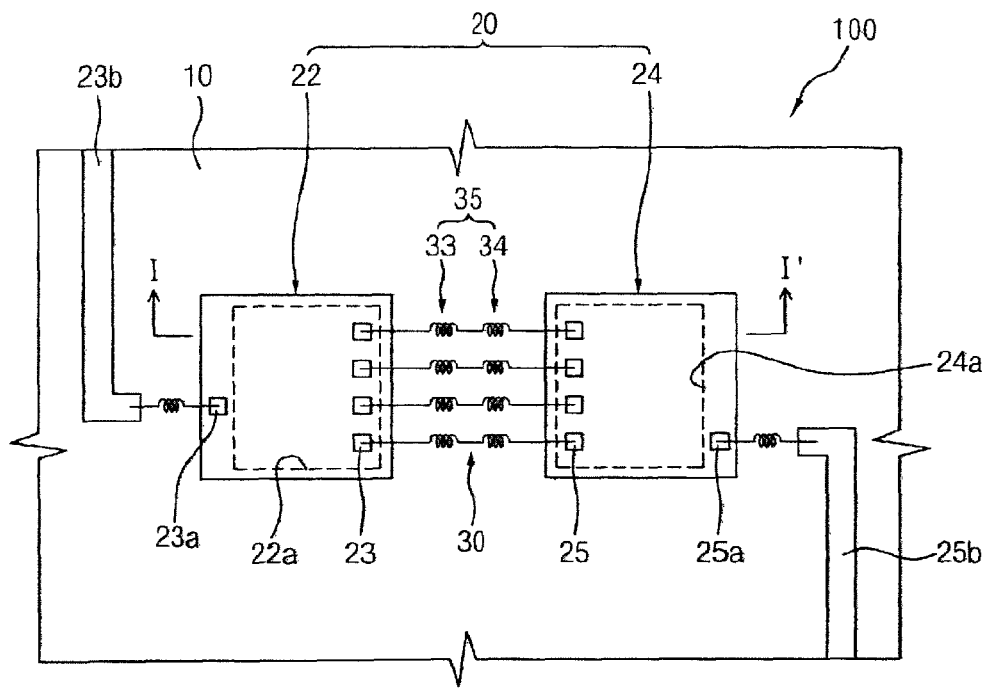
FIG. 1 is a plane view illustrating a flexible semiconductor package in accordance with an embodiment of the present invention.
Figure 2:
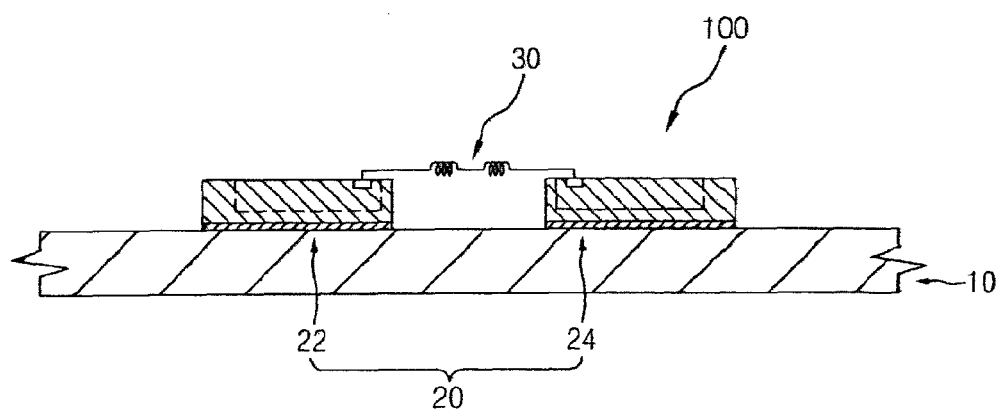
FIG. 2 is a cross-sectional view taken along a line I-I' of FIG. 1.

FIG. 1 is a plane view illustrating a flexible semiconductor package in accordance with an embodiment of the present invention, and FIG. 2 is a cross-sectional view taken along a line I-I' of FIG. 1.

Referring to FIGS. 1 and 2, a flexible semiconductor package 100 includes a flexible substrate 10, a semiconductor chip 20 and a conductive wire 30.

For example, the flexible substrate 10 is in the form of a plate, and the flexible substrate 10 includes a flexible material. In this embodiment, the flexible substrate 10 may include a synthetic resin which can be bent and twisted.

The semiconductor chip 20 is disposed on the flexible substrate 10. In the embodiment, at least two semiconductor chips 20 are disposed on an upper surface of the flexible substrate 10. The semiconductor chips 20 are disposed and spaced apart from each other by a distance.

In this embodiment, for example, two semiconductor chips 20 are disposed on the flexible substrate 10. Hereinafter, the semiconductor chips 20 are respectively defined as a first semiconductor chip 22 and a second semiconductor chip 24.

The first semiconductor chip 22 may include a circuit unit 22a and first bonding pads 23. The circuit unit 22a includes a data storing unit (not shown) storing data and a data processing unit (not shown) processing data. The first bonding pads 23 are electrically connected with the circuit unit 22a. For example, the first bonding pads 23 may be arranged at an edge of an upper surface of the first semiconductor chip 22. The first semiconductor chip 22 further includes a first input/output pad 23a which is electrically connected with a first input/output wiring 23b.

The second semiconductor chip 24 may include a circuit unit 24a and second bonding pads 25. The circuit unit 24a includes a data storing unit (not shown) storing data and a data processing unit (not shown) processing data. The second bonding pads 25 are electrically connected with the circuit unit 24a. For example, the second bonding pads 25 may be arranged at an edge of an upper surface of the second semiconductor chip 24. The second semiconductor chip 24 further includes a second input/output pad 25a which is electrically connected with a second input/output wiring 25b.

In this embodiment, the first bonding pads 23 of the first semiconductor chip 22 are disposed adjacent to the second bonding pads 25 of the second semiconductor chip 24.

A conductive wire 30 electrically connect together the first bonding pads 23 of the first semiconductor chip 22 and the second bonding pads 25 of the second semiconductor chip 24.

Each conductive wire 30 has at least one elastic portion 35. In the embodiment, for example, the conductive wire 30 shown in FIG. 1 has a first elastic portion 33 and a second elastic portion 34.

For example, the elastic portions 35 formed at the conductive wire 30 are in the form of a coil spring, respectively. The elastic portions 35 may be respectively wound in the form of the coil spring shape which can be then be correspondingly extended by deformation when the flexible substrate 10 is expanded transversely or bent up or down. Thereby the responsive deformation of the elastic portions 35 substantially aid in preventing the conductive wire 30 from being separated away from the first bonding pads 23 or the second bonding pads 24.

In order to prevent the conductive wire 30 from being separated from the first bonding pads 23 or the second bonding pads 24, the conductive wire 30 may be bent in the form of a sine curve shape. However, in case where the entire conductive wire 30 is bent in the form of a sine curve shape, a problem may arise in that the resultant entire length of the conductive wire 30 become too long after being deformed. Therefore, in this embodiment, since the elastic portion 35 is formed at a part of the conductive wire 30, the length of the conductive wire 30 can be reduced and also the conductive wire can be extended correspondingly to the deformation of the flexible substrate 30.

In the embodiment, each elastic portion 35 can be wound at least twice just in case the flexible substrate 30 is excessively expanded.

Figure 3:
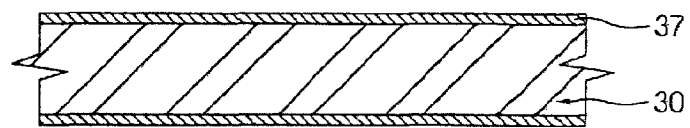
FIG. 3 is a cross-sectional view illustrating a conductive wire of FIG. 1.

In the embodiment, in order to prevent the elastic portions 35 of the conductive wires 30 from becoming electrically connected accidentally with each other, as shown in FIG. 3, each conductive wire 30 can further include an insulation film 37 covering the exposed surfaces of the conductive wires 30.

Figure 4:
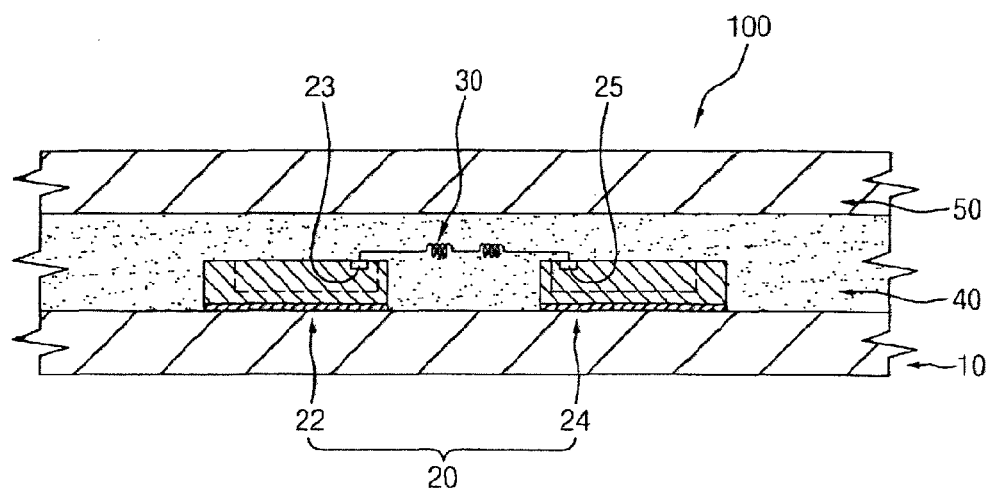
FIG. 4 is a cross-sectional view illustrating a flexible semiconductor package in accordance with another embodiment of the present invention.

FIG. 4 is a cross-sectional view illustrating a flexible semiconductor package in accordance with another embodiment of the present invention. The flexible semiconductor package in this embodiment is the same as that illustrated and described in FIGS. 1 through 3 except that a protection member and an additional flexible substrate are added. Therefore, the same portions as those in FIGS. 1 through 3 are denoted by the same reference numerals.

Referring to FIG. 4, the flexible semiconductor package 100 in accordance with the embodiment includes a flexible substrate 10, a semiconductor chip 20, a conductive wire 30, a protection member 40 and an additional flexible substrate 50.

The protection member 40 functions to cover the flexible substrate 10, the semiconductor chip 20 and the conductive wire 30 so as to protect the semiconductor chip 20 and the conductive wire 30 from impact and/or vibration applied from an outside.

In the embodiment, for example, the protection member 40 may include a flexible material like gel.

The additional flexible substrate 50 is disposed on the protection member 40. For example, the additional flexible substrate 50 can include the same material as that in the flexible substrate 10.

Figure 5:
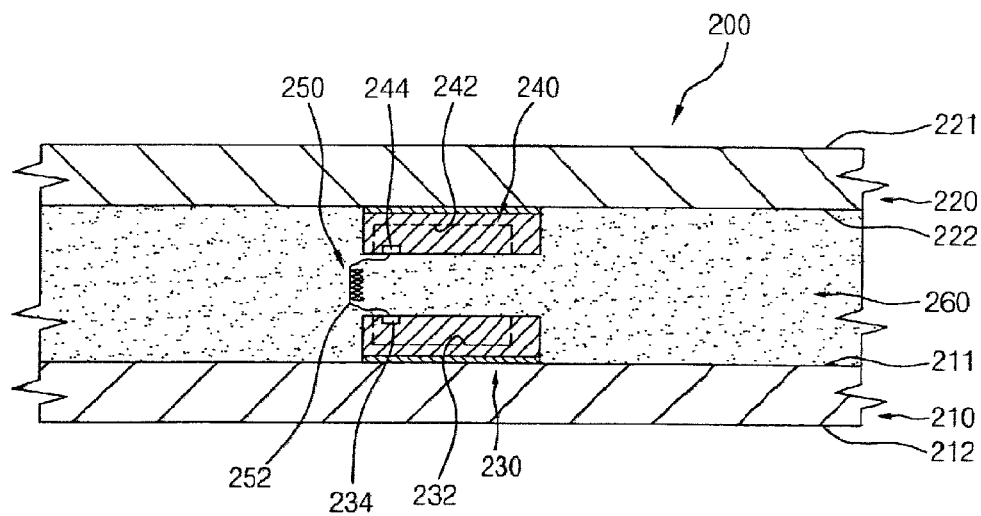
FIG. 5 is a cross-sectional view illustrating a flexible semiconductor package in accordance with yet another embodiment of the present invention.

FIG. 5 is a cross-sectional view illustrating a flexible semiconductor package in accordance with yet another embodiment of the present invention.

Referring to FIG. 5, the flexible semiconductor package 200 includes a first flexible substrate 210, a second flexible substrate 220, a first semiconductor chip 230, a second semiconductor chip 240, a conductive wire 250 and a filling member 260.

For example in this embodiment, the first flexible substrate 210 may be in the form of a plate which includes a flexible material. In the embodiment, the first flexible substrate 210 may include a synthetic resin that can be bent and twisted. The first flexible substrate 210 has a first surface 211 and a second surface 212 opposed to the first surface 211.

The second flexible substrate 220 in this embodiment may also be in the form of a plate and may also include a flexible material. In the embodiment, the second flexible substrate 220 may include a synthetic resin that can be bent and twisted. The second flexible substrate 220 has a third surface 221 and a fourth surface 222 opposed to the third surface 221.

In this embodiment, the second flexible substrate 220 is faced with the first flexible substrate 210, and the fourth surface 222 of the second flexible substrate 220 is faced with the first surface 211 of the first flexible substrate 210.

The first semiconductor chip 230 is disposed on the first surface 211 of the first flexible substrate 210. In the embodiment, at least two first semiconductor chips 230 can be disposed on the first surface 211 of the first flexible substrate 210.

The first semiconductor chip 230 includes a circuit unit 232 and first bonding pads 234. The circuit unit 232 includes a data storing unit (not shown) storing data and a data processing unit (not shown) processing data. The first bonding pads 234 are electrically connected with the circuit unit 232. For example, the first bonding pads 234 are arranged at an edge of an upper surface of the first semiconductor chip 230. The first semiconductor chip 230 may further include a first input/output pad, and the first input/output pad is electrically connected with a first input/output wiring (not shown) of the first flexible substrate 210.

The second semiconductor chip 240 is disposed on the fourth surface 222 of the second flexible substrate 220. In this embodiment, at least two second semiconductor chips 240 can be disposed on the fourth surface 221 of the second flexible substrate 220.

The second semiconductor chip 240 includes a circuit unit 242 and second bonding pads 244. The circuit unit 242 includes a data storing unit (not shown) storing data and a data processing unit (not shown) processing data. The second bonding pads 244 are electrically connected with the circuit unit 242. For example, the second bonding pads 244 are arranged at an edge of an upper surface of the second semiconductor chip 240. The second semiconductor chip 240 may further include a second input/output pad, and the second input/output pad is electrically connected with a first input/output wiring (not shown) of the second flexible substrate 220.

In the embodiment, for example, the first bonding pads 234 of the first semiconductor chip 230 are faced with the second bonding pads 244 of the second semiconductor chip 240.

The conductive wire 250 functions to electrically connect the first bonding pads 234 of the first semiconductor chip 230 and the second bonding pads 244 of the second semiconductor chip 240.

The conductive wire 250 has at least one elastic portion 252. In this embodiment, for example, the conductive wire 250 shown in FIG. 5 has two elastic portions 252.

The elastic portions 252 formed at the conductive wire 250 may be any form such as being in the form of a coil spring, as long as they are extendible. As shown, the elastic portions 252 are respectively wound in the form of the coil spring shape can be extended to respond to deformation of the first and second flexible substrates 210 and 220 when the first and second flexible substrates 210 and 220 are respectively expanded in a different direction. Thereby the elastic portions 252 aid in preventing the conductive wire 250 from being separated from the first bonding pads 234 or the second bonding pads 244.

In the embodiment, each elastic portion 252 can be wound at least twice just in case the first and second flexible substrates 210 and 220 are excessively expanded in the different direction, respectively.

In this embodiment, in order to prevent the elastic portions 252 of the conductive wire 250 from electrically connecting to one another, each conductive wire 250 can further include an insulation film 37 covering the exposed exterior of the conductive wire 250.

The filling member 260 is interposed between the first flexible substrate 210 and the second flexible substrate 220 so as to prevent damage of the first and second semiconductor chips 230 and 240 and the conductive wire 250 due to the external impact and/or vibration. In this embodiment, for example, the filling member 260 may include a gel.

Figure 6:
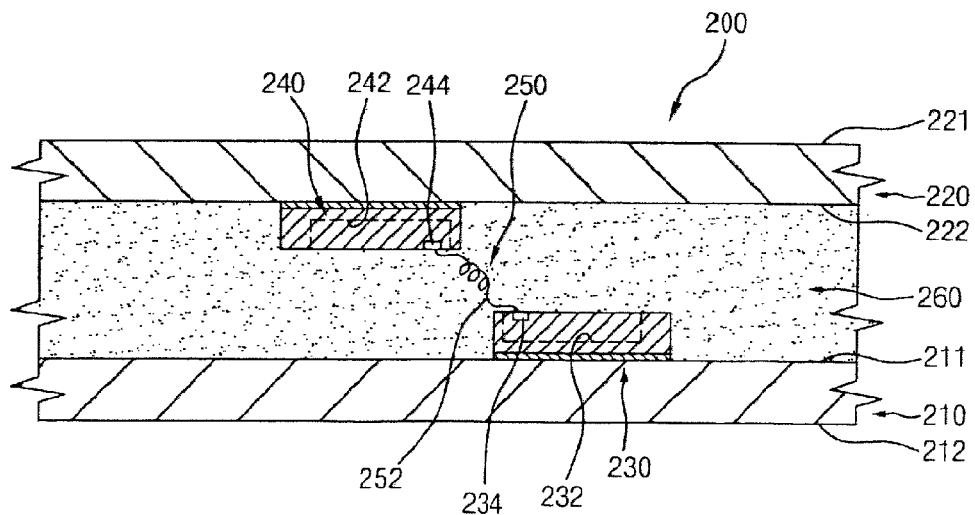
FIG. 6 is a cross-sectional view illustrating a flexible semiconductor package in accordance with modified embodiment of FIG. 5.

FIG. 6 is a cross-sectional view illustrating a flexible semiconductor package in accordance with a modified embodiment of FIG. 5. The flexible semiconductor package in the embodiment is the same as that illustrated and described in FIG. 5 except that this particular embodiment has a different arrangement of the first and second semiconductor chips. Accordingly, the same portions depicted in FIG. 5 are denoted by the same reference numerals.

Referring now to FIG. 6, the first semiconductor chip 230 on the first flexible substrate 210 and the second semiconductor chip 240 on the second flexible substrate 240 are disposed opposite to each other. The first and second semiconductor chips 230 and 240 are disposed so that the first and second bonding pads 234 and 244 are adjacent to each other. The first and second bonding pads 234 and 244 are electrically connected with each other through the conductive wire 250.

Figure 7:
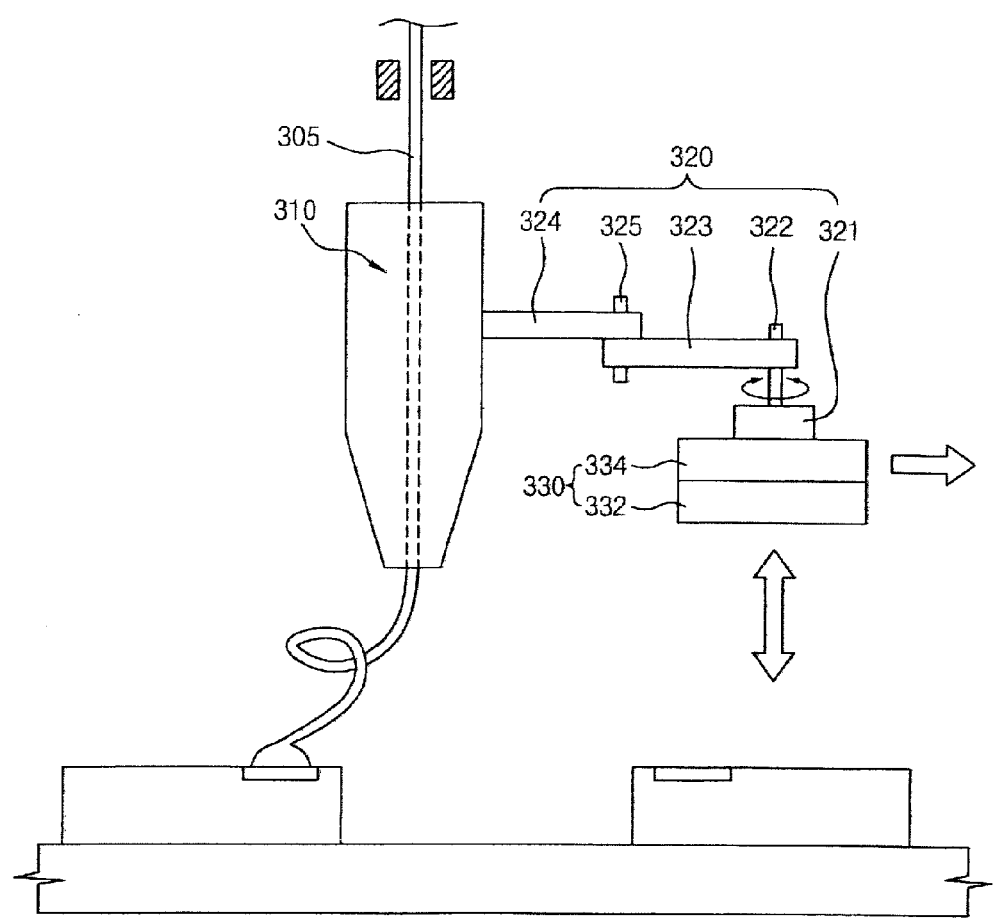
FIG. 7 is a cross-sectional view illustrating a wire bonding apparatus in accordance with an embodiment of the present invention.
Figure 8:
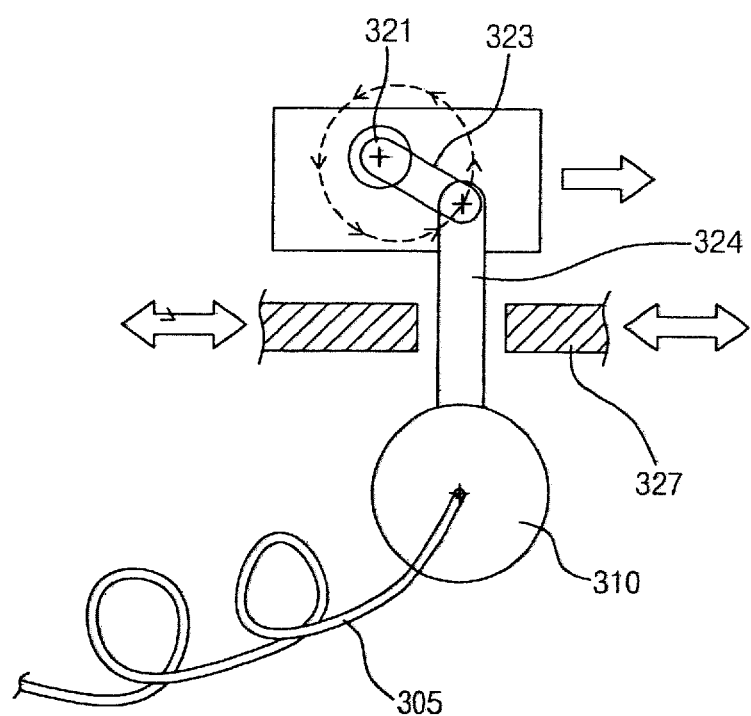
FIG. 8 is a plane view illustrating a process of forming a coil-shaped elastic portion by the wire bonding apparatus of FIG. 7.

FIG. 7 is a cross-sectional view illustrating a wire bonding apparatus in accordance with an embodiment of the present invention. FIG. 8 is a plane view illustrating a process of forming a coil-shaped elastic portion by the wire bonding apparatus of FIG. 7.

Referring now to FIGS. 7 and 8, the wire bonding apparatus 300 includes a capillary 310, a capillary rotating module 320 and a conveyer module 330. The wire bonding apparatus 300 in the embodiment has an appropriate construction for forming the elastic portion illustrated in FIGS. 1 and 6.

The capillary 310 has a cylindrical shape, and a tip is formed at an end of the capillary 310. The capillary 310 is formed with a hollow conduit through which the conductive wire 305 passes.

The capillary rotating module 320 includes a rotational unit 321, a rotational rod 323 and a capillary rotating rod 324.

The rotational unit 321 has a rotational shaft 322. For example, the rotational unit 321 may be a motor rotating the rotational shaft 322.

The rotational rod 323 has a bar shape, and one end of the rotational rod 323 is coupled to the rotational shaft 322, and the rotational rod 323 is rotated by rotation of the rotational shaft 322.

The capillary rotating rod 324 has a bar shape, and one end of the capillary rotating rod 324 is coupled to the capillary 310 and the other end of the capillary rotating rod 324 is hinged to the other end of the rotational rod 323 by a hinge pin 325.

Therefore, when the capillary rotating rod 324 is moved by the rotation of the rotational rod 323, the capillary rotating rod 324 is rotated while being guided by a guide member 327. The capillary rotating rod 324 is moved to trace preferably a circle by the guide member 327.

Referring now to FIG. 8, when the rotational rod 323 is rotated by the rotational unit 321 and the conductive wire 305 is provided from the capillary 310, the capillary rotating rod 324 is rotated 360° by the rotational rod 323, and thus the conductive wire 305 is wound in the form of a coil shape.

The conveyer module 330 includes an up-down unit 332 and a conveyer unit 334.

The capillary rotating module 320 is fixed to the conveyer module 330, and the conveyer unit 334 horizontally conveys the capillary rotating module 320 and capillary 310.

For example, the up-down unit 332 is fixed to the conveyer unit 334, and the up-down unit 332 vertically conveys the conveyer unit 334, the capillary rotating module 320 and capillary 310.

As is apparent from the above description, in the present invention, since a part of the conductive wire, which electrically connects the semiconductor chips, is wound in the form of the coil. The coil shape aids in preventing the conductive wire from being separated from the attached semiconductor chips when the flexible substrate on which the semiconductor chips are mounted is bent, expanded or twisted.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A flexible semiconductor package, comprising:
a first flexible substrate;
a second flexible substrate opposed to the first flexible substrate;
a first semiconductor chip disposed on an upper surface of the first flexible substrate and which has a first bonding pad;
a second semiconductor chip disposed on a lower surface of the second flexible substrate faced with the upper surface of the first flexible substrate and which has a second bonding pad;
a conductive wire electrically connecting together the first and second bonding pads to each other and which has at least one elastic portion; and
a flexible filling member interposed between the first and second flexible substrates.

2. The flexible semiconductor package according to claim 1, wherein the flexible filling member includes a gel.

3. The flexible semiconductor package according to claim 1, wherein the conductive wire comprises at least two elastic portions.

4. The flexible semiconductor package according to claim 1, wherein the conductive wire comprises an insulation film covering the conductive wire.

5. The flexible semiconductor package according to claim 1, wherein the elastic portion has a coil spring shape.

6. The flexible semiconductor package according to claim 1, wherein the first bonding pad of the first semiconductor chip and the second bonding pad of the second bonding pad are disposed to substantially face each other.

7. The flexible semiconductor package according to claim 1, wherein the first semiconductor chip and the second semiconductor chips are disposed to substantially face with each other.

8. The flexible semiconductor package according to claim 1, wherein the first semiconductor chip and the second semiconductor chips are disposed opposite to each other such that the first and second bonding pads are adjacent to each other.

* * * * *